United States Patent Office 3,467,630

Patented Sept. 16, 1969

3,467,630

METHOD OF PRODUCING LIGHT-SENSITIVE PHOTOCROSSLINKABLE POLYMERS

Justus Danhäuser, Heinrich Gold, and Hans Holtschmidt, Cologne-Stammheim, and Willibald Pelz, Opladen, Germany, assignors to Agfa-Gevaert Aktiengesellschaft, Leverkusen, Germany, a corporation of Germany No Drawing. Filed July 29, 1966, Ser. No. 568,749
Claims priority, application Germany, Aug. 28, 1965, A 50,136
Int. Cl. C08f *27/06;* G03c *1/68*
U.S. Cl. 260—79.5 1 Claim

ABSTRACT OF THE DISCLOSURE

This invention relates to the production of light sensitive polymers which are a photocrosslinkable layer in photographic material by the solution of an unsaturated hydrocarbon polymer in a molecular weight of 10,000 to 250,000 with sulphenyl chlorides carrying photosensitive groups. The photographic material prepared from the resultant film-forming polymer exhibits improved resistance to acids.

Soluble, film-forming, light-sensitive polymers may become insoluble upon exposure to actinic light. Light-sensitive layers may contain photocrosslinkable polymers and their use in photomechanical processes.

It is known that certain polymers are light-sensitive. When a thin layer of such a polymer on a suitable support is exposed to light the solubility is changed image-wise in such a way that the unexposed areas of the layer remain soluble in certain solvents and can be dissolved out by subsequent treatment with a solvent, whilst the exposed areas of the layer become insoluble.

Suitable polymers include those containing, for example, cinnamic acid or chalkone groups. It is also known that there can be used for the foregoing purpose polymers which contain azide groups and which on exposure to light undergo crosslinking accompanied by the elimination of nitrogen from the azide groups, thus rendering the polymer insoluble.

Such prior art light-sensitive polymers have, however, certain drawbacks. For instance, crosslinked polymers containing cinnamic acid groups are not sufficiently resistant to concentrated acids, so that they cannot be used in the etching of noble metals to obtain images. Other polymers which show a high resistance to acids, are not sufficiently stable in storage so that crosslinking occurs on storage.

In addition, some of these polymers are extremely difficult to prepare, whilst the removal of by-products involves considerable expense.

The object of the present invention is to provide a photographic material containing a photocrosslinkable layer of film-forming polymers which exhibit both an improved sensitivity to light and an improved resistance to chemicals, particularly to acids.

We now have found that soluble, light-sensitive polymers in which the side-chain contains the light-sensitive groups is linked to the polymers through a thioether group, show a high sensitivity, a high resistance to acids and high thermostability, coupled with a limited tendency to swell in the solvent used as developer. The polymers according to the invention include those which contain the following recurring unit in random distribution:

wherein:

R=a recurring unit of the polymer chain,

X=a bivalent organic radical joining the group Y to the sulfur, preferably an arylene bridge, more particularly a bivalent radical of the benzene or naphthalene series such as phenylene or naphthylene, which may be substituted for example, by halogen such as fluorine, chlorine or bromine, alkyl with preferably up to 5 carbon atoms, alkoxy with preferably up to 5 carbon atoms, cyano, nitro, or alkylsulfone groups with preferably up to 5 carbon atoms; although the type of substituent used is not critical, it is important that they should not in any way affect the properties of the photosensitive polymers;

Y=any photosensitive unit which is able to initiate cross-linking of the polymer-chains by exposure to light, preferably azide, carbonazide or sulfonylazide $$(—SO_2N_3)$$

groups, further cinnamic acid derivatives, such as cinnamic acid esters, having preferably up to 6 carbon atoms.

In copolymers additional units $R_1$, $R_2$ etc. differing from R are present and the copolymers can therefore be represented as

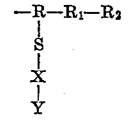

wherein X and Y have the same meaning as mentioned above.

Products which are suitable for most purposes are those which contain one recurring unit having a photosensitive group for every 1 to 20 other recurring units in the polymer chain. A ratio of approximately 3:10 is preferred.

Thioether groupings corresponding to the following formulae have proved to be particularly suitable:

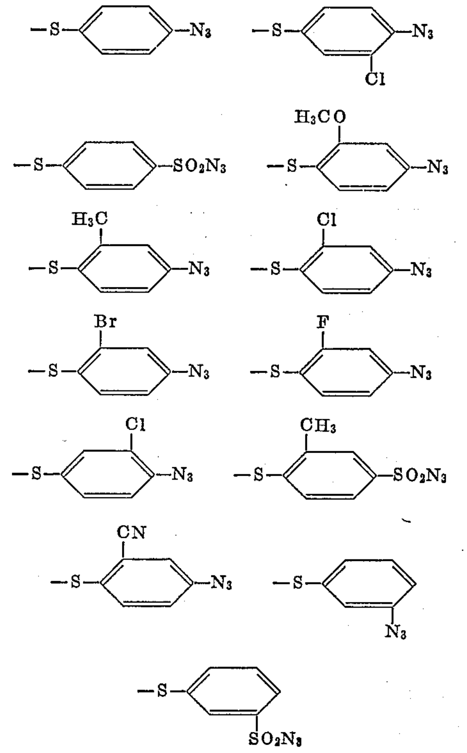

Representative inherently light-sensitive polymers include those containing the following recurring polymeric units:

| | | |
|---|---|---|
| I | 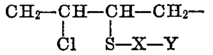 | Derived from homopolymers or copolymers of 1,3-butadiene (1,4-addition). |
| II | 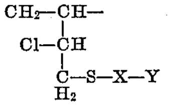 | Derived from homopolymers or copolymers of 1,3-butadiene (1,2-addition). |
| III | 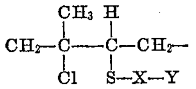 | Derived from homopolymers or copolymers of isoprene. |
| IV | 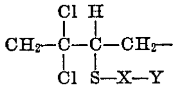 | Derived from homopolymers or copolymers of 2-chlor-1,3-butadiene. |
| V | 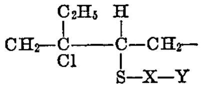 | Derived from homopolymers or copolymers of 2-ethyl-1,3-butadiene. |
| VI | 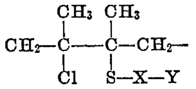 | Derived from homopolymers or copolymers of 2,3-dimethyl-1,3-butadiene. |

The polymers according to the invention can be obtained by reacting sulphenyl chlorides carrying photosensitive groups, in suitable solvents, with polymers containing double bonds. In this reaction, the sulphenyl chloride group is added in known manner to the double bond.

In another embodiment of the invention, the sulfenyl chlorides are reacted with polymers containing aromatic nuclei or acid —CH groups, whereby the substitution is accompanied by the elimination of hydrogen chloride.

We refer to Houben-Weyl "Methoden der Organischen Chemie," vol. 14/1. The sulphenyl chlorides are prepared by chlorination of the corresponding disulfides, for instance, of 4,4'-diazido-diphenyldisulfide. The chlorination can be performed in a suitable solvent such as methylene chloride, chloroform, carbontetrachloride, 1,2-dichloroethane and the like at temperatures between —50° and +70° C. preferably between —5° and +20° C.

Practically any synthetic or natural high molecular weight compounds containing aromatic nuclei, acid CH groups or olefinic double bonds, are suitable, for example, polyisoprene in the form of natural rubber or synthetic polymers, polybutadiene, copolymers of butadiene with styrene preferably containing between 20 and 30% by weight of styrene, copolymers of butadiene with acrylonitrile, preferably containing 10 to 45% by weight of acrylonitrile, as well as polymers of 2-chlorobutadiene, and copolymers of isobutylene with butadiene or isoprene, preferably those copolymers derived from at least 90% by weight of isobutylene.

Polymers obtained by the after-treatment of natural or synthetic rubber, including the aforementioned polymers, have proved to be particularly suitable, preferably the so-called cyclo-rubber obtained by cyclising polyisoprene, for example. We refer in this connection to Houben-Weyl "Methoden der Organischen Chemie," vol. 14/2 (1963), particularly pages 773 and 834–836. After-chlorinated rubbers, such as chlorinated polybutadiene or polyisoprene, partially hydrogenated rubber or hydroxylated rubber, can also be used.

The polymeric reaction components should with advantage have an average molecular weight of more than 1000. The average molecular weight best suited to the particular purpose envisaged can very easily be determined by means of the conventional tests. The most favourable molecular weight range will, of course, depend upon the type of polymer used. Molecular weights in the range from 10,000 to 250,000 are preferred.

Particularly suitable products are those of which 5 to 100 mol percent consists of the structural units carrying the photosensitive thioether grouping.

The polymeric components may be reacted in any ratio with the photosensitive sulfenyl chlorides. It is important, however, for the photosensitive groups to be present in a concentration high enough for the required degree of crosslinking. It can be assumed in this respect that the sufenyl chlorides react quantitatively with the aforementioned polymers.

The addition of sulfenyl chlorides to polymers containing double bonds is preferably carried out at room temperature in an anhydrous non-polar solvent. Methylene chloride, chloroform, xylene, benzene or aliphatic hydrocarbons, are particularly suitable solvents for this purpose. The reaction of the sulfenyl chlorides with the acid CH products is carried out at 60 to 80° C. in methylene chloride, chloroform or aliphatic hydrocarbons, optionally in the presence of Lewis acids.

In general, the solution formed after the reactants have been reacted, may be directly used to prepare the photocrosslinkable layers. These solutions can be applied to supports or substrates of any kind by dipping, spraying or by casting.

The photosensitivity of the polymers used may be considerably increased by the sensitisers normally used for such purposes, for example, 4 - N-quinolizin - 4 - one, Michler's ketone, N-phenyl acridone, compounds from the group of naphthothiazolines, or cyanines.

The layers prepared in accordance with the invention are exposed to light provided by the sources normally used for reproduction purposes such as carbon arc lamps or xenon lamps.

In general, exposed layers should be developed with organic solvents in which the crosslinked layer components show only a limited tendency to swell. Solvents such as xylene, cyclohexanone, butyl acetate, methylene chloride, petrol, petroleum ether or mixtures thereof are preferred.

The photosensitive polymers may be used either by themselves or in physical mixture with other polymers. This second form of application is often advantageous because mixtures having specific properties can be prepared in this way.

Examples of suitable mixture components are homopolymers or copolymers of vinyl acetate, ethylene, and derivatives of acrylic acid or methacrylic acid such as acrylamide or methacrylates, particularly with short-chain aliphatic alcohols, as well as butadiene, isoprene, styrene or vinyl alcohol. Copolymers of vinyl acetate, vinyl alcohol, ethylene and norbornadiene or cyclopentadiene, and copolymers of butadiene or isoprene with styrene and/or acrylonitrile, are particularly suitable.

The polymer mixtures have the advantage, for example, that undesired premature crosslinking of the photosensitive polymers during preparation of the layer is almost completely prevented. In addition, mixtures exhibiting the required properties, for example, with regard to adhesion to a specific support, chemical resistance, etc. and the easiness of cross-linking, can be prepared by suitable choice of the second polymer component. It has been found that polymers which still contain olefinic or aromatic double bonds are particularly suitable. The only factor which has to be taken into consideration in this connection is that the mixture components used should exhibit the required chemical properties. Double bond systems of this kind may be present in the polymers in any form within the main polymer chain or in the side chains. Butyl rubber and copolymers with cyclopentadiene or bornadiene are examples of polymers with such double bond systems.

The ratio of photosensitive polymers to the mixture component is largely dependent upon the number of photosensitive groups present in the polymer. In the case of the polymers referred to above as being particularly suitable, which contain one photosensitive group for every 1 to 20 polymerised units, approximately 10% by weight of the photosensitive components can in many cases be sufficient. However, mixtures containing 40% by weight and more of the photosensitive polymers, are in many cases particularly suitable.

Example 1

5.4 g. of polybutadiene with a molecular weight of approximately 200,000 are dissolved in 100 ml. of xylene. 9.25 g. of p-azidophenyl-sulphenyl chloride are added dropwise to the resulting solution at room temperature over a period of 5 minutes.

140 mg. of Michler's ketone are added to the solution which is then filtered. It is cast as a thin layer onto a thoroughly cleaned zinc plate and then dried for 10 minutes in air. The photosensitive element thus prepared is exposed behind a lined original to the light of a carbon arc lamp with a lighting intensity of 1200 lux for 10–60 secs. and then developed in xylene. A negative copy of the original with clearly marked edges is obtained. Etching with nitric acid produces a printable original.

Example 2

10 g. of a copolymer of styrene and butadiene (27% by weight of styrene) are dissolved in 150 ml. of chloroform. 6 g. of 4-azido-2-chlorophenyl-sulphenyl chloride dissolved in 20 ml. of xylene, are added dropwise to the resulting solution at room temperature over a period of 10 minutes.

160 mg. of N-methyl-benzoyl-methylene-$\beta$-naphthothiazoline as sensitizer are added to the resulting solution which is then filtered. The resulting mixture is applied onto an aluminium plate and then further processed as in Example 1.

Example 3

10 g. of a copolymer of isobutylene and isoprene (isoprene component 3 mol percent) with a double bond content of 3 mol percent, are dissolved in 100 ml. of benzene. 6 g. of p-sulphazido-phenyl-sulphenyl chloride dissolved in 20 ml. of xylene are added dropwise with stirring to the resulting solution at room temperature.

The solution is stirred for another hour, after which 160 mg. of Michler's ketone are added to it and it is filtered. Following exposure to light and development in a mixture of xylene and petrol, a layer prepared with this solution is highly resistant to nitric acid.

Example 4

10 g. of a cyclorubber polyisoprene, approximately 90% of whose double bonds are cyclized, are dissolved in 80 ml. of chloroform. Following the addition of 2 g. of aluminium chloride, 6 g. of p-azidophenyl-sulphenyl chloride are added dropwise with stirring to the resulting solution at room temperature. Stirring is continued for three hours until there is no more evolution of HCl, after which the reaction product is precipitated by methanol. After it has been dried, the polymer is dissolved in 60 ml. of xylene and sensitized with 100 mg. of Michler's ketone.

The layer is processed as described in Example 1. The resulting printing form shows outstanding resistance to concentrated acids.

We claim:

1. A process for preparing a light-sensitive polymer that is relatively soluble in a solvent but becomes substantially insoluble in that solvent upon exposure to light, the process comprising the steps of dissolving in an inert solvent an unsaturated hydrocarbon polymer that has a molecular weight of from about 10,000 to about 250,000, and adding to the solution an amount of an azido aryl sulfenyl chloride to cause the chlorine and the azido aryl sulfenyl portion of the chloride to add to double bonds in the polymer.

References Cited

UNITED STATES PATENTS

| | | | |
|---|---|---|---|
| 3,002,003 | 9/1961 | Merrill et al. | 96—91 XR |
| 3,023,100 | 2/1962 | Thoma et al. | 96—115 XR |

NORMAN G. TORCHIN, Primary Examiner

R. H. SMITH, Assistant Examiner

U.S. Cl. X.R.

96—91, 115; 204—159.11; 260—79, 772